(12) United States Patent
Seino (10) Patent No.: US 9,640,410 B2
(45) Date of Patent: May 2, 2017

(54) PATTERN FORMATION METHOD

(71) Applicant: KABUSHIKI KAISHA TOSHIBA, Tokyo (JP)

(72) Inventor: Yuriko Seino, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/808,109

(22) Filed: Jul. 24, 2015

(65) Prior Publication Data

US 2016/0276167 A1    Sep. 22, 2016

(30) Foreign Application Priority Data

Mar. 16, 2015  (JP) ................................ 2015-052471

(51) Int. Cl.
| | | |
|---|---|---|
| *G03F 7/004* | (2006.01) | |
| *H01L 21/311* | (2006.01) | |
| *G03F 7/16* | (2006.01) | |
| *G03F 7/00* | (2006.01) | |
| *G03F 7/40* | (2006.01) | |
| *H01L 21/027* | (2006.01) | |

(Continued)

(52) U.S. Cl.
CPC ........ *H01L 21/31138* (2013.01); *G03F 7/002* (2013.01); *G03F 7/0035* (2013.01); *G03F 7/165* (2013.01); *G03F 7/40* (2013.01); *H01L 21/0273* (2013.01); *H01L 21/0337* (2013.01); *H01L 21/31116* (2013.01); *H01L 21/31144* (2013.01); *B81C 1/00031* (2013.01); *B82Y 40/00* (2013.01)

(58) Field of Classification Search
CPC .......... G03F 7/002; G03F 7/40; G03F 7/0035; G03F 7/165; H01L 21/31144; H01L 21/0275; H01L 21/31138; H01L 21/02118; H01L 21/30604; B82Y 40/00; B82Y 30/00; B81C 1/00031; B81C 2201/0149

USPC ....... 430/322, 312, 313, 314, 325, 329, 330, 430/331; 438/703, 761; 216/41, 49, 67

See application file for complete search history.

(56) References Cited

U.S. PATENT DOCUMENTS 9,129,909 B2 *  9/2015  Kobayashi ........ H01L 21/02118
9,177,825 B2 * 11/2015  Seino ................ H01L 21/31144

(Continued)

FOREIGN PATENT DOCUMENTS

JP    2013-201356    10/2013

OTHER PUBLICATIONS

Chi-Chun Liu et al., "Towards an all-track 300 mm process for directed self-assembly", *Journal of Vacuum Science & Technology B*, vol. 29, Issue 6, pp. 06F203-1-06F203-6., (2011).

*Primary Examiner* — Amanda C Walke
(74) *Attorney, Agent, or Firm* — Finnegan, Henderson, Farabow, Garrett & Dunner, LLP (57) ABSTRACT

According to one embodiment, a pattern formation method includes forming a resist pattern on an underlying film, slimming the resist pattern, forming a pinning portion having affinity for a first polymer by depositing, on a surface of the slimmed resist pattern, an etching product produced by etching the underlying film, forming a neutral, film having affinity for the first polymer and a second polymer on the underlying film after the etching, forming a block copolymer film containing the first polymer and the second polymer on the pinning portion and the neutral film, forming a microphase separation pattern by applying a predetermined process to the block copolymer film to perform microphase separation.

10 Claims, 9 Drawing Sheets

(51) Int. Cl.
*H01L 21/033* (2006.01)
*B81C 1/00* (2006.01)
*B82Y 40/00* (2011.01)

(56) References Cited

U.S. PATENT DOCUMENTS

| | | | |
|---|---|---|---|
| 2009/0275694 A1* | 11/2009 | Baldwin-Hendricks | C08G 77/04 |
| | | | 524/588 |
| 2012/0015537 A1* | 1/2012 | Park ..................... | H01R 13/521 |
| | | | 439/271 |
| 2014/0038318 A1 | 2/2014 | Sato | |
| 2014/0087566 A1 | 3/2014 | Kato et al. | |
| 2014/0097152 A1 | 4/2014 | Hieda et al. | |
| 2014/0295669 A1* | 10/2014 | Kawanishi .......... | H01L 21/0271 |
| | | | 438/702 |
| 2014/0315390 A1* | 10/2014 | Abdallah ............ | H01L 21/3081 |
| | | | 438/703 |
| 2014/0322917 A1* | 10/2014 | Abdallah ............ | H01L 21/3081 |
| | | | 438/703 |
| 2015/0227530 A1* | 8/2015 | Liu ................. | H04M 1/274583 |
| | | | 707/734 |

* cited by examiner

PATTERN FORMATION METHOD

CROSS-REFERENCE TO RELATED APPLICATIONS

This application is based upon and claims the benefit of priority from Japanese Patent Application No. 2015-052471, filed Mar. 16, 2015, the entire contents of which are incorporated herein by reference.

FIELD

Embodiments described herein relate generally to a pattern formation method.

BACKGROUND

As the lithography technique of semiconductor devices, a method using directed self-assembly (DSA) is suggested. Using the DSA technique, a fine pattern can be formed.

However, when the DSA technique is used as the lithography technique, the process takes longer.

In consideration of this factor, a pattern formation method which is reduced in the number of manufacturing steps is required.

DETAILED DESCRIPTION

In general, according to one embodiment, a pattern formation method includes: forming a resist pattern on an underlying film; slimming the resist pattern; forming a pinning portion having affinity for a first polymer by depositing, on a surface of the slimmed resist pattern, an etching product produced by etching the underlying film; forming a neutral film having affinity for the first polymer and a second polymer on the underlying film after the etching; forming a block copolymer film containing the first polymer and the second polymer on the pinning portion and the neutral film; forming a microphase separation pattern by applying a predetermined process to the block copolymer film to perform microphase separation, the microphase separation pattern having a structure in which a first portion formed of the first polymer and a second portion formed of the second polymer are arranged; and removing one of the first portion and the second portion.

Embodiments will be described hereinafter with reference to the accompanying drawings. The methods shown in the following embodiments 1 to 3 are applicable to a method of manufacturing a semiconductor device (semiconductor integrated circuit device).

(Embodiment 1)

Figure 1A:
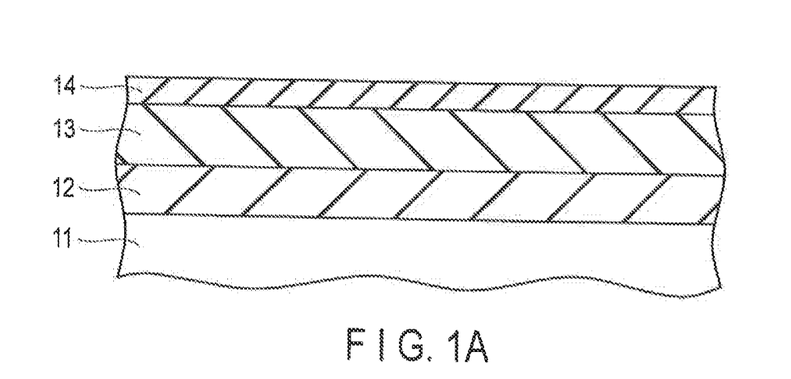
FIG. 1A, FIG. 1B, FIG. 1C, FIG. 1D, FIG. 1E, FIG. 1F, FIG. 1G, FIG. 1H and FIG. 1I are cross-sectional views schematically showing a pattern formation method according to a first embodiment.

FIG. 1A to FIG. 1I are cross-sectional views schematically showing a pattern formation method according to a first embodiment. This specification explains the pattern formation method of the present embodiment below with reference to FIG. 1K to FIG. 1I, First, as shown in FIG. 1A, as a film, to be processed, a silicon oxide film 12 having a thickness of 100 nm is formed on a base structure 11 including a semiconductor substrate, a transistor, etc. Subsequently, a spin-on-carbon (SOC) film 13 having a thickness of 150 nm is formed on the silicon oxide film 12, The SOC film 13 functions as a hard mask and an antireflection film. Further, as an underlying film, a spin-on-glass (SOG) film 14 having a thickness of 35 nm is formed on the SOC film 13. In general, a film containing silicon can be used as an underlying film.

Figure 1B:
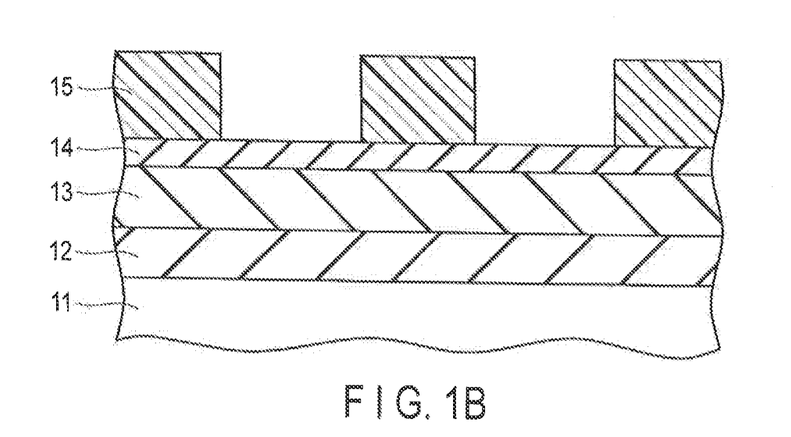

Next, as shown in FIG. 1B, a positive resist pattern 15 is formed on the SOG film 14. Specifically, first, the positive photoresist film 15 having a thickness of 100 nm is formed on the SOG film 14 by spin coating. Subsequently, the photoresist film 15 is exposed by immersion exposure using an ArF excimer laser (the exposure amount being 15 $mJ/cm^2$). Further, developing is performed using a TMAH developer. In this mariner, a line-and-space (L/S) pattern having a width of 45 nm is obtained as the resist pattern 15.

Figure 1C:
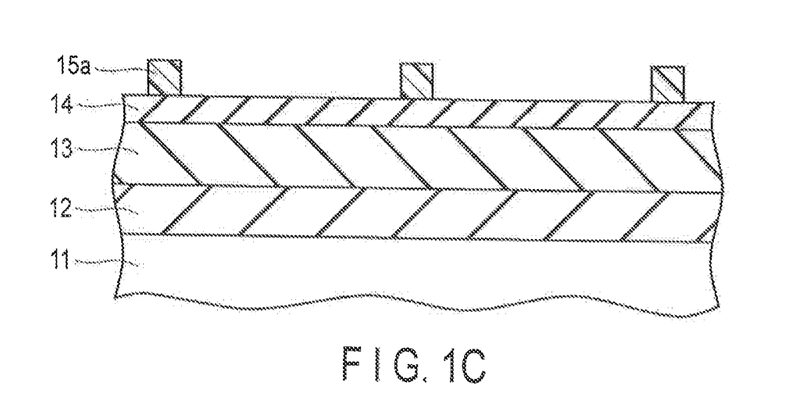

Next, as shown in FIG. 1C, the resist pattern 15 is slimmed. Specifically, reactive ion etching (RIE) is performed using an oxygen gas ($O_2$). In this manner, a slimmed resist pattern. 15a having a width of 15 nm is formed.

Figure 1D:
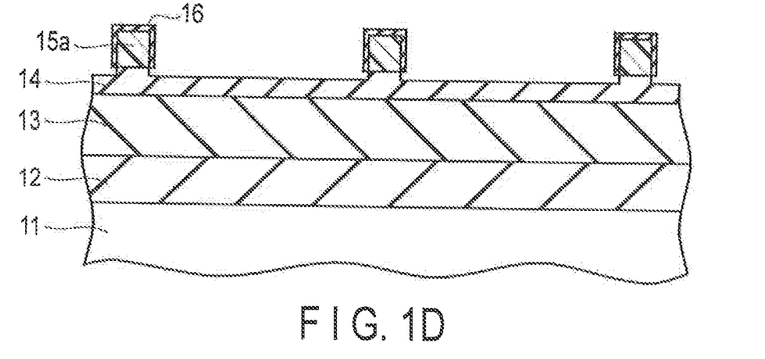

Next, as shown in FIG. 1D, the SOG film 14 is etched using the slimmed resist pattern 15a as a mask. Thus, the SOG film 14 is made thin. Specifically, the SOG film 14 is etched by RIE using CF-based gas. The etching amount, (etching depth) is approximately 5 nm. By etching the SOG film 14, an etching product containing silicon is produced. The etching product is deposited on the surface of the slimmed resist pattern 15a. As a result, a pinning portion 16 having affinity for polymethyl methacrylate (PMMA; a first polymer) is formed on the surface of resist pattern 15a as described later. The pinning portion 16 is insoluble to an organic solvent used in the subsequent steps.

Figure 1E:
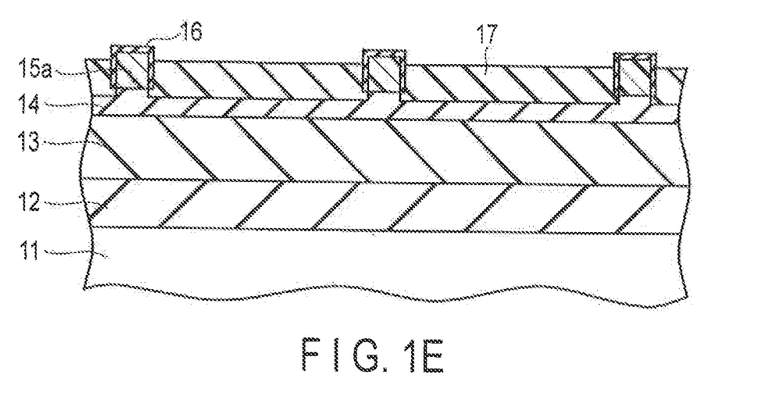

Next, as shown in FIG. 1E, a hydroxy-terminated poly (styrene-random-methyl methacrylate) (P(S-r-MMA)-OH) film 17 is coated onto the SOG film 14 which was made thin by etching. Subsequently, the P(S-r-MMA)-OH film 17 is heated to react with the SOG film 14.

Figure 1F:
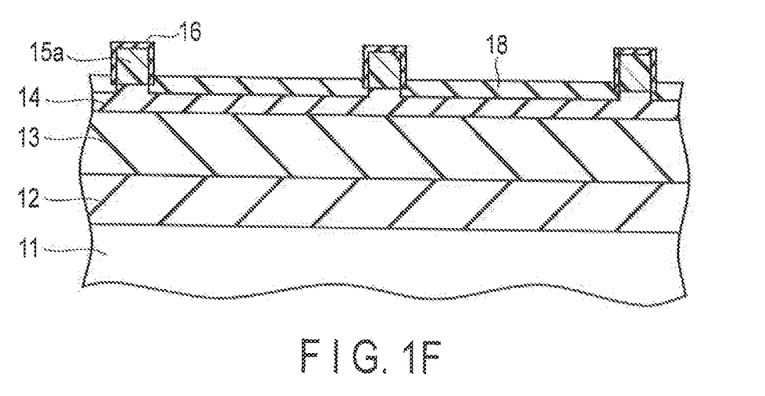

Next, as shown in FIG. 1F, the non-reacted portion of the P(S-r-MMA)-OH film 17 is removed by a PGMEA thinner. Thus, a neutral film 18 is formed on the SOG film 14. The neutral film 18 has affinity for polymethyl mathacrylate (PMMA; the first polymer) and polystyrene (PS; a second polymer). The thickness of the neutral, film 18 is approximately 7 nm.

Figure 1G:
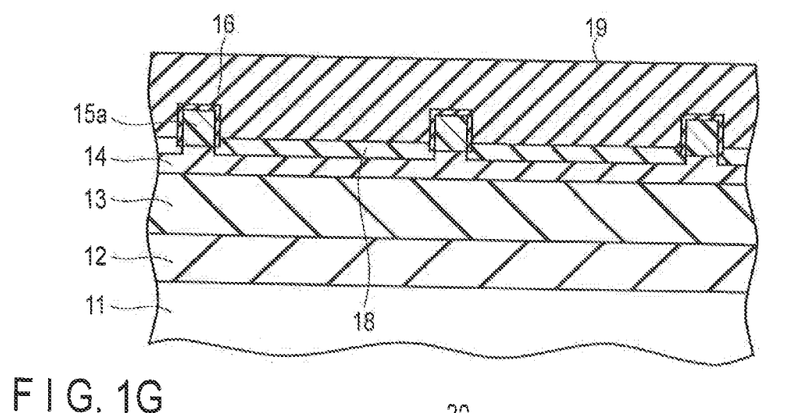

Next, as shown in FIG. 1G, a block copolymer film 19 containing PMMA and FS is formed on the pinning potion 16 and the neutral, film 18. Specifically, as the block copolymer, PS-b-PMMA (the volume composition ratio of PMMA to PS being 1:1) is adjusted so as to have a concentration of 1.0 wt % by a PGMEA solution. The adjusted solution is rotated at 1500 rpm and is coated onto the pinning portion 16 and the neutral film 18.

Figure 1H:
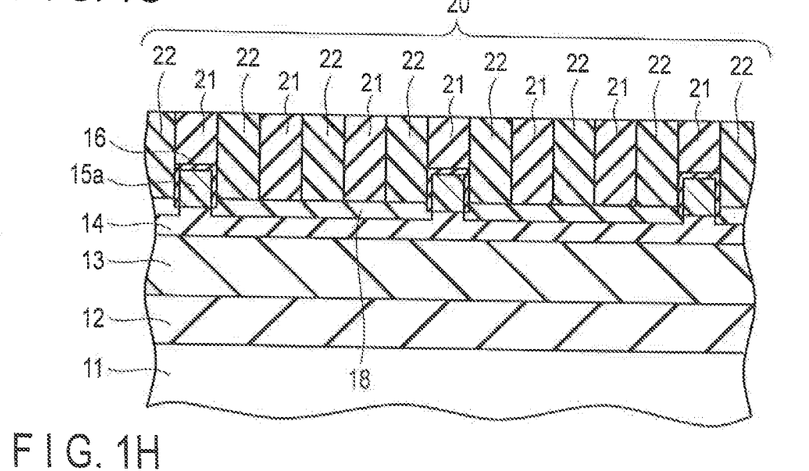

Next, as shown in FIG. 1H, a thermal process is applied as a predetermined process to me block copolymer film 19. Specifically, first, a baking process is applied for one minute at 110° C. Further, an annealing process is applied for two minutes at 240° C. in an atmosphere of a nitrogen gas ($N_2$). In this manner, microphase separation is performed for the block copolymer film 19. In the microphase separation, PMMA is extracted on the pinning portion 16. As a result, a microphase separation pattern 20 is formed on the pinning portion 16 and the neutral film 18. In the microphase separation pattern 20, a PMMA portion (first portion) 21 formed of PMMA (the first polymer) and a PS portion (second portion) 22 formed of PS (the second polymer) are alternately arranged. The PMMA portion 21 is provided on the pinning portion 16.

The above microphase separation pattern 20 is explained below.

The neutral film 18 contains a PMMA component and a PS component. Thus, the water contact angle of the neutral film 18 is at the middle between the water contact angle of PMMA and the water contact angle of PS. Both PMMA and PS have affinity for the neutral film. On the other hand, when the etching product of the SOG film 14 is deposited on the surface of the slimmed resist pattern 15a, the pinning portion 16 whose affinity is high for PMMA and low for PS is formed on the surface of resist pattern 15a. In the pinning portion 16, the affinity for PMMA is higher than the affinity for PS. Therefore, PMMA is preferentially attached to the pinning portion 16. A unit of block copolymer is equivalent to a combination between a PMMA molecule and a PS molecule. PMMA is combined with PMMA. PS is combined with PS. In this manner, the arrangement PMMA-PMMA-PS-PS-PMMA-PMMA-PS-PS is obtained by the above thermal process.

By applying the thermal process described above to the block copolymer film 19, the microphase separation pattern 20 shown in FIG. 1H is obtained.

Figure 1I:
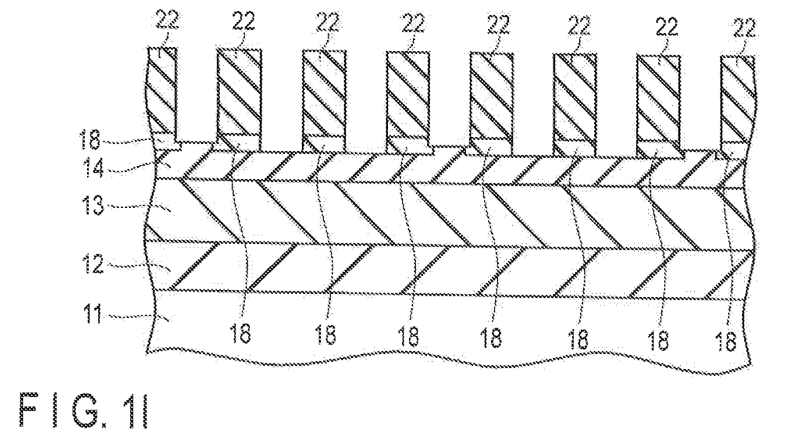

Next, as shown in FIG. 1I, one of the PMMA portion 21 and the PS portion 22 is removed. In the present embodiment, the PMMA portion 21 is selectively removed. Specifically, the PMMA portion 21 is removed by RIE using an oxygen gas ($O_2$). At this time, the neutral film 18 and resist pattern 15a which are positioned under the PMMA portion 21 are also removed. As a result, a line-and-space (L/S) pattern having a half-pitch of 15 nm is formed.

Now, this specification explains the subsequent steps which are not shown in the drawings. The PS portion 22 is used as a mask to etch the SOG film 14 and the SOG film 13. By this etching, the pattern of the PS portion 22 is transferred to the SOG film 14 and the SOG film 13. Further, the patterns of the SOG film 14 and the SOC film 13 are used as masks to etch the silicon oxide film 12. In this manner, a line-and-space (L/S) pattern formed by the silicon oxide film 12 is obtained.

As described above, according the present embodiment, the SOG film 14 is etched in the step of FIG. 1D. By this etching, an etching product is deposited on the surface of the slimmed resist pattern 15a. Thus, the pinning portion 16 having a high affinity for PMMA is formed on the surface of resist pattern 15a. By applying a predetermined process (thermal process) to the block copolymer film 19 in the step of FIG. 1H, the microphase separation pattern 20 is obtained. In the microphase separation pattern 20, the PMMA portion 21 is allocated on the pinning portion 16, and further, the PMMA portion 21 and the PS portion 22 are alternately arranged. After the above pattern is formed, one of the PMMA portion 21 and the PS portion 22 is selectively removed. In this manner, it is possible to form a fine pattern in the small number of steps.

In the present embodiment, resist pattern 15a is formed by a positive resist. However, resist pattern 15a may be formed by a negative resist.

(Embodiment 2)

FIG. 2A to FIG. 2I are cross-sectional views schematically showing a pattern formation method according to a second embodiment. This specification explains the pattern formation method of the present embodiment below with reference to FIG. 2A to FIG. 2I. The basic matters are similar to those of the first embodiment. Thus, the explanation of matters that are described in the first embodiment is omitted.

Figure 2A:
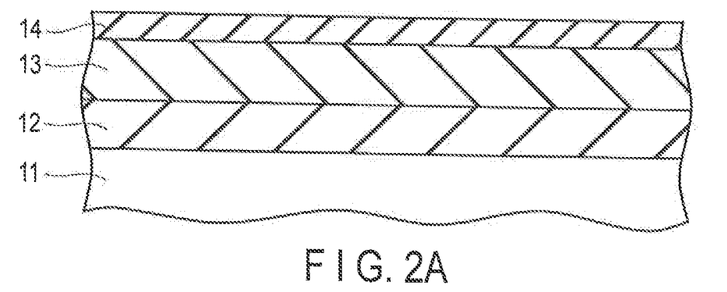
FIG. 2A, FIG. 2B, FIG. 2C, FIG. 2D, FIG. 2E, FIG. 2F, FIG. 2G, FIG. 2H and FIG. 2I are cross-sectional views schematically showing a pattern formation method according to a second embodiment.

First, as shown in FIG. 2A, in a manner similar to that of the first embodiment, a silicon oxide film 12, an SOC film 13 and an SOG film 14 are formed on a base structure 11.

Figure 2B:
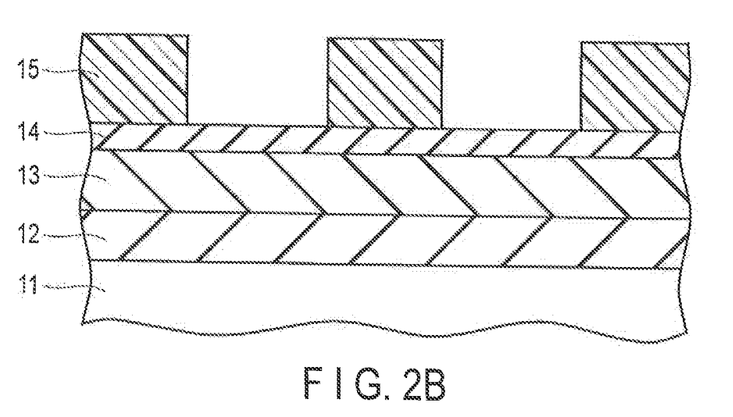

Next, as shown in FIG. 2B, in a manner similar to that of the first embodiment, a positive resist pattern 15 is formed on the SOG film 14.

Figure 2C:
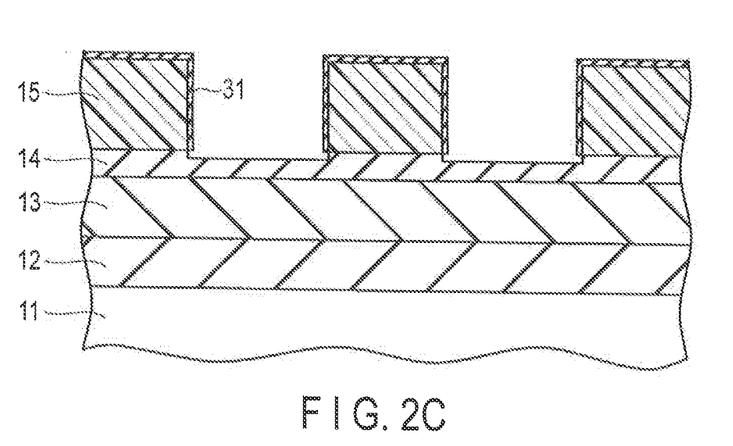

Next, as shown in FIG. 2C, the resist pattern 15 is used as a mask to etch the SOG film 14. By this etching, the SOG film 14 is made thin. Specifically, the SOG film 14 is etched by RIE using CF-based gas. The etching amount (etching depth) is approximately 5 nm. By etching the SOG film 14, an etching product is produced. The etching product is deposited on the surface of the resist pattern 15. As a result, an etching product layer 31 is formed on the surface of the resist pattern 15.

Figure 2D:
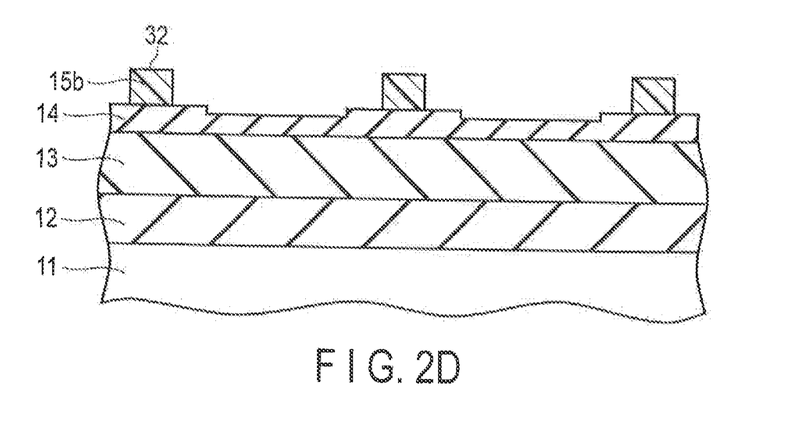

Next, as shown in FIG. 2D, the resist pattern 15 is slimmed. Specifically, RIE is performed using an oxygen gas ($O_2$). In this manner, a slimmed resist pattern 15b having a width of 15 nm is formed. By this slimming process, a pinning portion 32 having affinity for PMMA (a first polymer) is formed. Specifically, the surface of the slimmed resist pattern 15b is modified by applying RIE using an oxygen gas. In this manner, the pinning portion 32 is formed. The pinning portion 32 is insoluble to an organic solvent used in the subsequent steps.

Figure 2E:
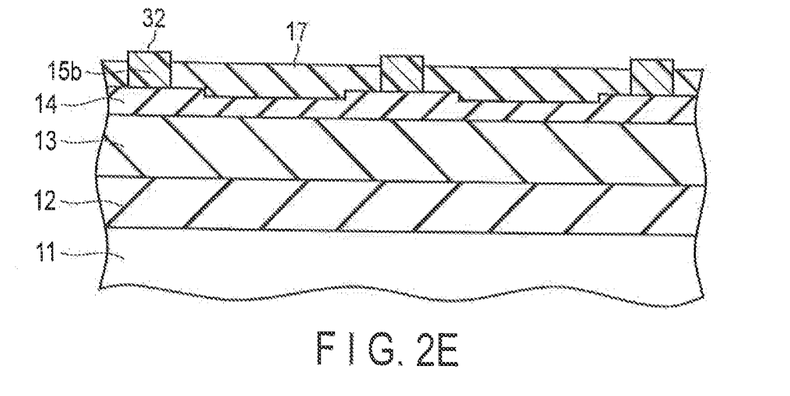

Next, as shown in FIG. 2E, a P(S-r-MMA)-OH film 17 is coated onto the SOG film 14 which is not covered by the slimmed resist pattern 15b. Subsequently, the P(S-r-MMA)-OH film 17 is heated to react with the SOG film 14.

Figure 2F:
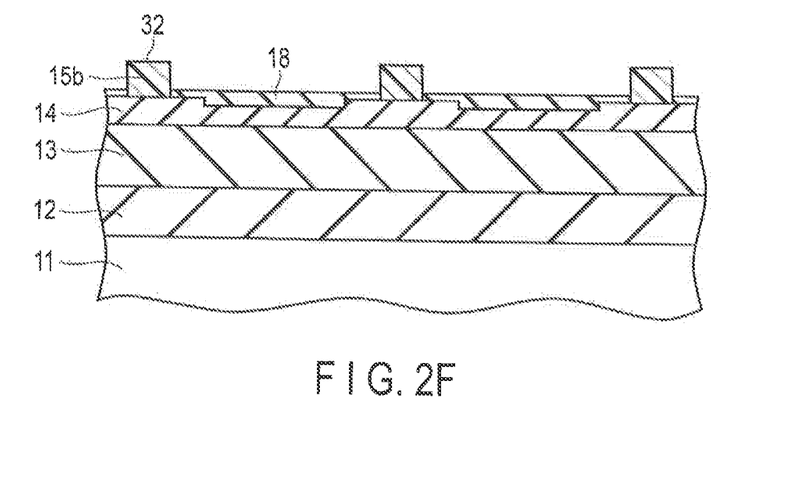

Next, as shown in FIG. 2F, the non-reacted portion of the P(S-r-MMA)-OH film 17 is removed by a PGMEA thinner. In this manner, a neutral film 18 is formed on the SOG film 14 which is not covered by the slimmed resist pattern 15b. The neutral film 18 has affinity for PMMA (the first polymer) and PS (a second polymer).

Figure 2G:
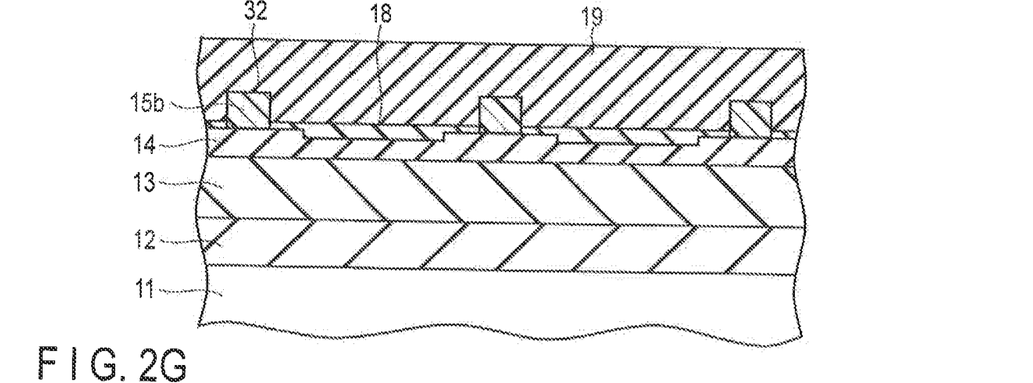

Next, as shown in FIG. 2G, a block copolymer film 19 containing PMMA and PS is formed on the pinning portion 32 and the neutral film 18. The block copolymer film 19 is the same as that of the first embodiment.

Figure 2H:
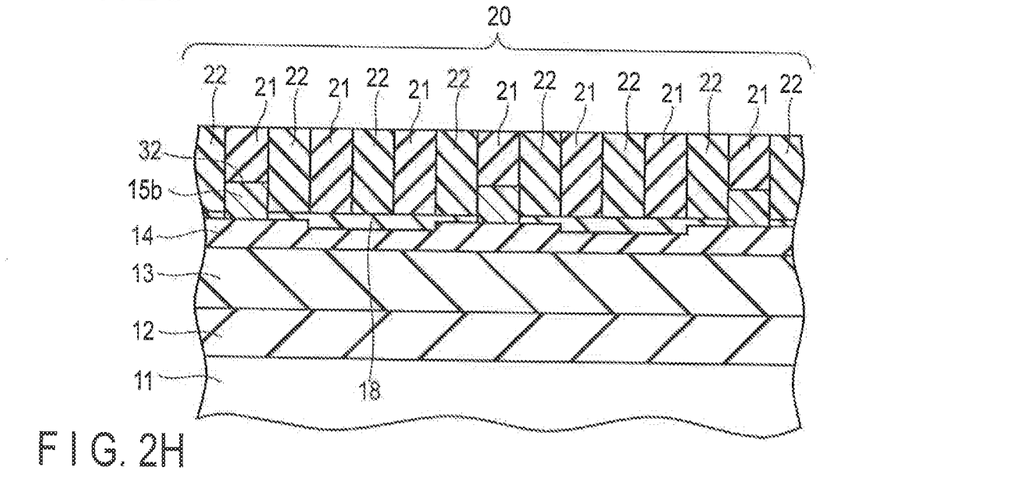

Next, as shown in FIG. 2H, a thermal process is applied as a predetermined process to the block copolymer film 19. This thermal process is the same as that of the first embodiment. By this thermal process, microphase separation is performed for the block copolymer film 19. In this manner, PMMA is extracted on the pinning portion 32. As a result, a microphase separation pattern 20 is formed on the pinning portion 32 and the neutral film 18. In a manner similar to that of the first embodiment, in the microphase separation pattern 20, a PMMA portion (first portion) 21 and a PS portion (second portion) 22 are alternately arranged, and further, the PMMA portion 21 is allocated on the pinning portion 32.

Figure 2I:
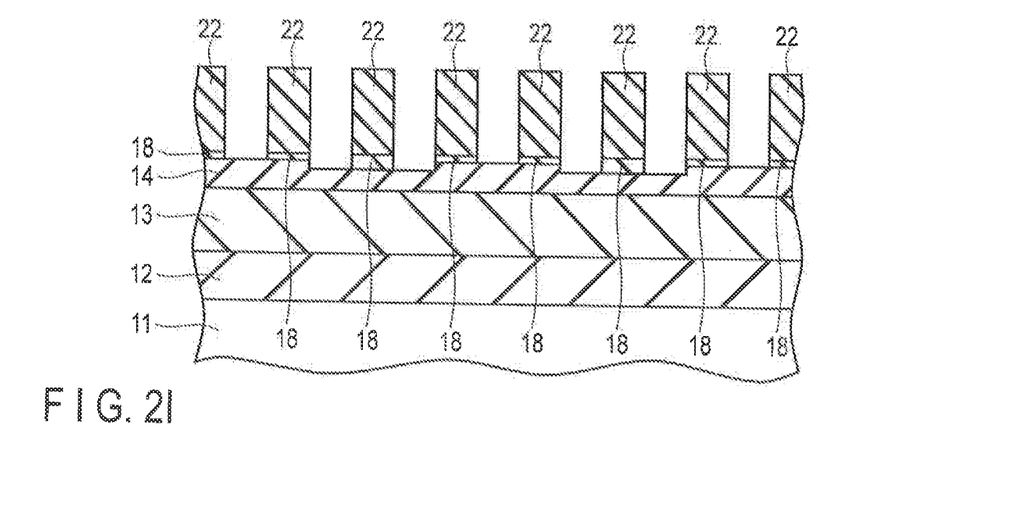

Next, as shown in FIG. 2I, one of the PMMA portion 21 and the PS portion 22 is removed. In the present embodiment, in a manner similar to that of the first embodiment, the PMMA portion 21 is selectively removed. At this time, the neutral film 18 and resist pattern 15b which are positioned under the PMMA portion 21 are also removed. As a result, a line-and-space (L/S) pattern having a half-pitch of 15 nm is obtained.

Subsequently, steps (not shown) similar to those of the first embodiment are performed. As a result, a line-and-space (L/S) pattern formed by the silicon oxide film 12 is obtained.

As described above, according to the present embodiment, when the resist pattern 15 is slimmed in the step of FIG. 2D, the surface of the resist pattern is modified. Thus, the pining portion 32 having a high affinity for PMMA is formed. In a manner similar to that of the first embodiment, the microphase separation pattern 20 having a structure in which the PMMA portion 21 and the PS portion 22 are alternately arranged is obtained. It is possible to form a fine pattern in the small number of steps.

In the present embodiment, resist pattern 15b is formed by a positive resist. However, resist pattern 15b may be formed by a negative resist.

In the present embodiment, the step of FIG. 2D may be performed after the step of FIG. 2B without performing the step of FIG. 2C.

(Embodiment 3)

FIG. 3A to FIG. 3H are cross-sectional views schematically showing a pattern formation method according to a third embodiment. This specification explains the pattern formation method of the present embodiment below with reference to FIG. 3A to FIG. 3H. The basic matters are similar to those of the first embodiment. Thus, the explanation of matters that are described in the first embodiment is omitted.

Figure 3A:
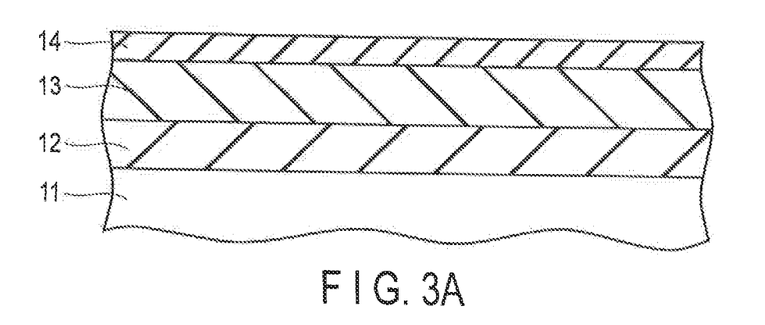
FIG. 3A, FIG. 3B, FIG. 3C, FIG. 3D, FIG. 3E, FIG. 3F, FIG. 3G and FIG. 3H are cross-sectional views schematically showing a pattern formation method according to a third embodiment.

First, as shown in FIG. 3A, in a manner similar to that of the first embodiment, a silicon oxide film 12, a SOG film 13 and a SOG film 14 are formed on a base structure 11.

Figure 3B:
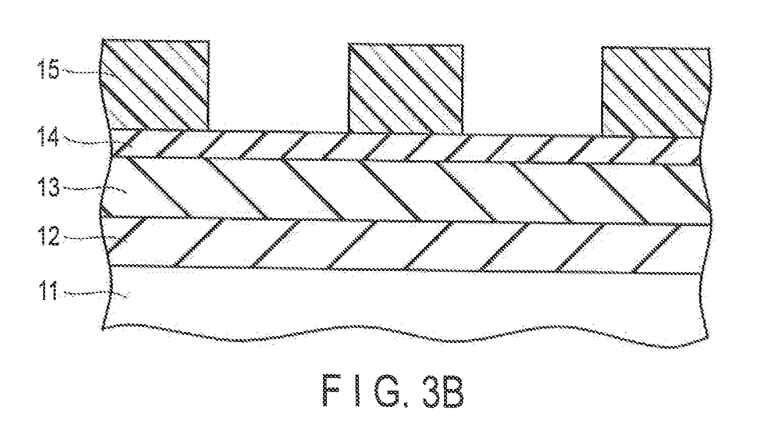

Next, as shown in FIG. 3B, in a manner similar to that of the first embodiment, a resist pattern 15 is formed on the SOG film 14. In the present embodiment, the resist pattern 15 is a negative resist, pattern.

Figure 3C:
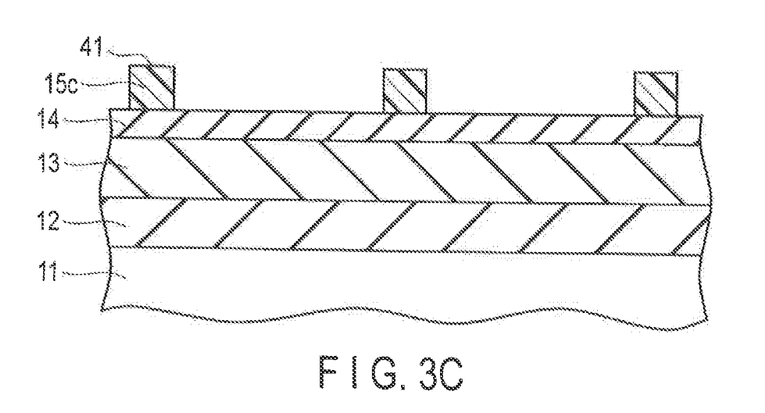

Next, as shown in FIG. 3O, the resist pattern 15 is slimmed. Specifically, RIE is performed using an oxygen gas ($O_2$). In this manner, a slimmed resist pattern 15c having a width of 15 nm is formed. By this slimming process, a pinning portion 41 having affinity for PMMA (a first polymer) is formed. Specifically, the surface of the slimmed resist pattern is modified by applying RIE using an oxygen gas. In this manner, the pinning portion 41 is formed. The pinning portion 41 is insoluble to an organic solvent used in the subsequent steps.

Figure 3D:
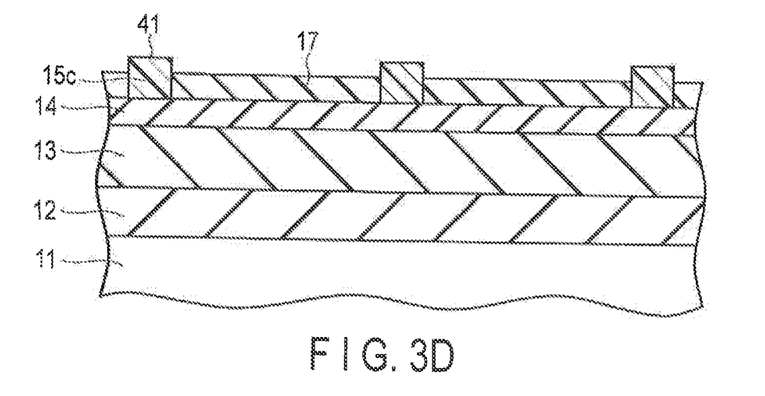

Next, as shown in FIG. 3D, a P(S-r-MMA)-OH film 17 is coated onto the SOG film 14 which is not covered by the slimmed resist pattern 15c, Subsequently, the P(S-r-MMA)-OH film 17 is heated to react with the SOG film 14.

Figure 3E:
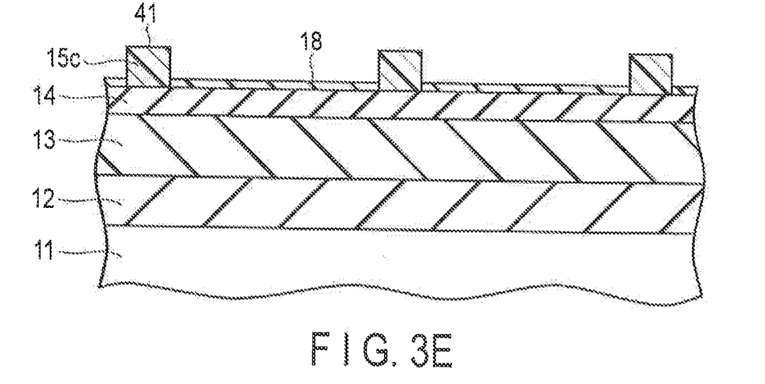

Next, as shown in FIG. 3E, the non-reacted portion of the P-(S-r-MMA)-OH film 17 is removed by a PGMEA thinner. In this manner, a neutral film 18 having affinity for PMMA (the first polymer) and PS (a second polymer) is formed on the SOG film 14 which is not covered by the slimmed resist pattern 15c.

Figure 3F:
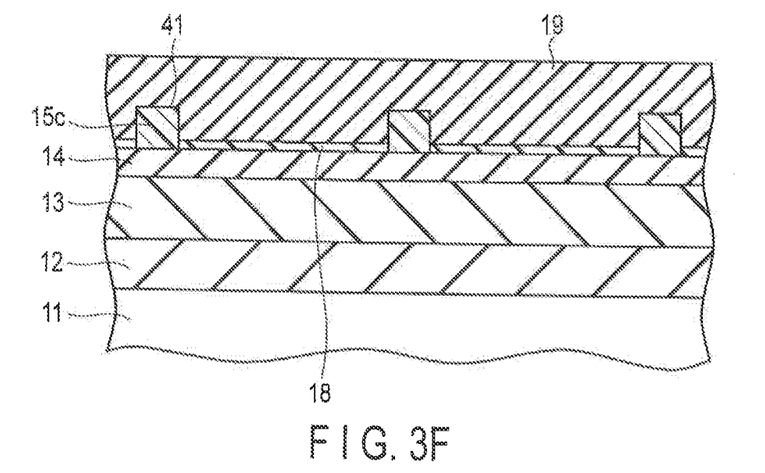

Next, as shown in FIG. 3F, a block copolymer film 19 containing PMMA and PS is formed on the pinning portion 41 and the neutral film 18. The block copolymer film 19 is the same as that of the first embodiment.

Figure 3G:
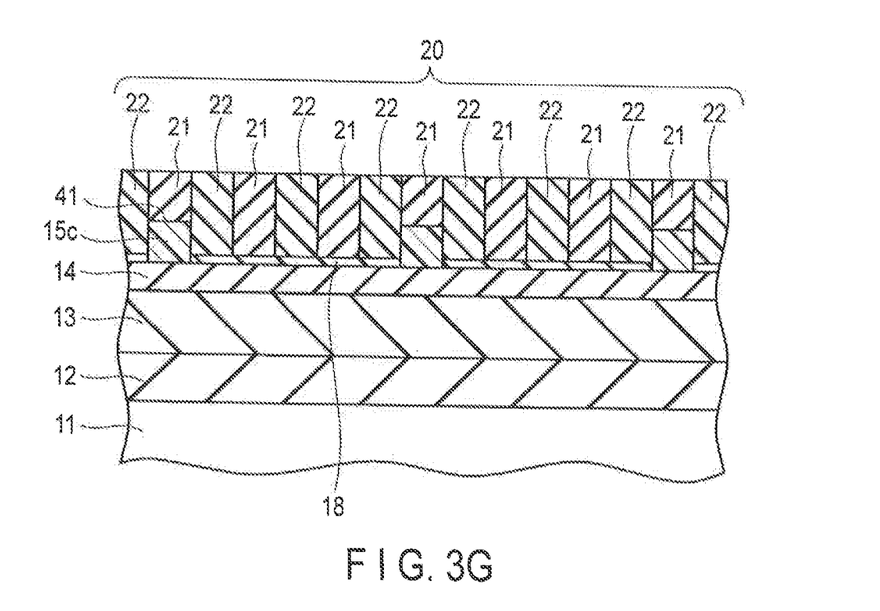

Next, as shown in FIG. 3G, a thermal process is applied as a predetermined process to the block copolymer film 19. This thermal process is the same as that of the first embodiment. By this thermal process, microphase separation is performed for the block copolymer film 19. In this manner, PMMA is extracted on the pinning portion 41. As a result, a microphase separation pattern 20 is formed on the pinning portion 41 and the neutral film 18. In a manner similar to that of the first embodiment, in the microphase separation pattern 20, a PMMA portion (first portion) 21 and a PS portion (second portion) 22 are alternately arranged, and further, the PMMA portion 21 is allocated on the pinning portion 41.

Figure 3H:
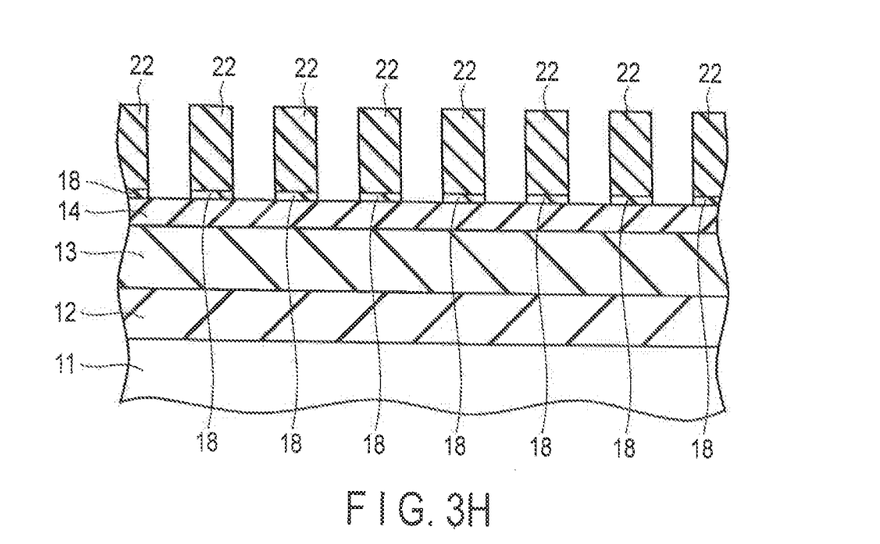

Next, as shown in FIG. 3H, one of the PMMA portion 21 and the PS portion 22 is removed. In the present embodiment, in a manner similar to that of the first embodiment, the PMMA portion 21 is selectively removed. At this time, the neutral film 18 and resist pattern 15c which are positioned under the PMMA portion 21 are also removed. As a result, a line-and-space (L/S) pattern having a half-pitch of 15 nm is obtained.

Subsequently, steps (not shown) similar to those of the first embodiment are performed. As a result, a line-and-space (L/S) pattern formed by the silicon oxide film 12 is obtained.

As stated above, according to the present embodiment, when the resist pattern 15 is slimmed in the step of FIG. 3C, the surface of the resist pattern is modified. Thus, the pinning portion 41 having a high affinity for PMMA is formed. In a manner similar to that of the first embodiment, the microphase separation pattern 20 having a structure in which the PMMA portion 21 and the PS portion 22 are alternately arranged is obtained. It is possible to form a fine pattern in the small number of steps.

In the present embodiment, resist pattern 15c is formed by a negative resist. However, resist pattern 15c may be formed by a positive resist.

In the above first, second and third embodiments, the resist pattern 15 is formed by immersion exposure using an ArF excimer laser. However, the resist pattern 15 may be formed by optical lithography using EUV light and nanoimprint lithography.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method comprising:
   forming a resist pattern on an underlying film;
   forming a pinning portion having affinity for a first polymer by slimming the resist pattern;
   forming a neutral film having affinity for the first polymer and a second polymer on a part of the underlying film which is not covered by the slimmed resist pattern;
   forming a block copolymer film containing the first polymer and the second polymer on the pinning portion and the neutral film;
   forming a microphase separation pattern by applying a predetermined process to the block copolymer film to perform microphase separation, the microphase separation pattern having a structure in which a first portion formed of the first polymer and a second portion formed of the second polymer are arranged;
   removing one of the first portion and the second portion; and
   etching the underlying film before slimming the resist pattern.

2. The method of claim 1, wherein
   a surface of the slimmed resist pattern is modified.

3. The method of claim 1, wherein
the resist pattern is slimmed using an oxygen gas.

4. The method of claim 1, wherein
the underlying film contains silicon.

5. The method of claim 1, wherein
the underlying film is formed of spin-on glass (SOG).

6. The method of claim 1, wherein
the first polymer is polymethyl methacrylate (PMMA), and the second polymer is polystyrene (PS).

7. The method of claim 1, wherein
the predetermined process includes a thermal process.

8. The method of claim 1, wherein
the resist pattern is formed of a positive resist.

9. The method of claim 1, wherein
the resist pattern is formed of a negative resist.

10. The method of claim 1, wherein
a line-and-space pattern is formed by removing one of the first portion and the second portion.

* * * * *